(12) United States Patent  
Lin et al.

(10) Patent No.: US 7,149,121 B2  
(45) Date of Patent: Dec. 12, 2006

(54) METHOD AND APPARATUS FOR CHANGING OPERATING CONDITIONS OF NONVOLATILE MEMORY

(75) Inventors: Yu-Shen Lin, Taipei (TW); Hsien-Wen Hsu, Sanchong (TW)

(73) Assignee: Macronix International Co., Ltd., Hsinchu (TW)

( * ) Notice: Subject to any disclaimer, the term of this patent is extended or adjusted under 35 U.S.C. 154(b) by 64 days.

(21) Appl. No.: 11/043,550

(22) Filed: Jan. 26, 2005

(65) Prior Publication Data

US 2006/0164887 A1    Jul. 27, 2006

(51) Int. Cl.  
*G11C 16/06*    (2006.01)

(52) U.S. Cl. .......................... 365/185.22; 365/185.24; 365/185.29

(58) Field of Classification Search ........... 365/185.22, 365/185.24, 185.29  
See application file for complete search history.

(56) References Cited

U.S. PATENT DOCUMENTS

| | | | |
|---|---|---|---|
| 5,982,670 A * | 11/1999 | Yamashita | ............. 365/185.22 |
| 6,011,725 A | 1/2000 | Eitan | |
| 6,643,177 B1 | 11/2003 | Le et al. | |
| 2003/0151950 A1 | 8/2003 | Tamada et al. | |

* cited by examiner

*Primary Examiner*—Huan Hoang  
(74) *Attorney, Agent, or Firm*—Kenta Suzue; Haynes Beffel & Wolfeld LLP

(57) ABSTRACT

A nonvolatile memory array is associated with counting memory that stores data on a number of times a particular threshold state is reached in the associated nonvolatile memory. The aging physical characteristics of the nonvolatile memory can be compensated by adjusting the operating conditions of the nonvolatile memory. The operating conditions vary depending on the data stored in the counting memory.

29 Claims, 6 Drawing Sheets

METHOD AND APPARATUS FOR CHANGING OPERATING CONDITIONS OF NONVOLATILE MEMORY

BACKGROUND OF THE INVENTION

1. Field of the Invention

The present invention relates to nonvolatile memory and integrated circuits including such memory, and more particularly to architectures for such devices supporting the storage of data on the use of the nonvolatile memory.

2. Description of Related Art

Electrically programmable and erasable nonvolatile memory technologies, such as flash memory and charge trapping memory, have many applications. Technologies based on floating gates, like EEPROM, and localized charge trapping structures like oxide-nitride-oxide memory cells known in various architectures as SONOS cells and NROM, are typically programmable and erasable many times.

The operating characteristics of nonvolatile memory cells change over the lifetime of the nonvolatile memory cells. As nonvolatile memory cells undergo an increasing number of program and erase cycles, the operational characteristics of the nonvolatile memory cells change. This aspect of nonvolatile memory technologies is problematic, because nonvolatile memory cells are expected to operate predictably over their expected lifetimes, regardless of the number of program and erase cycles any particular nonvolatile memory cell has experienced.

One approach to the varying behavior of nonvolatile memory cells due to an increasing number of program and erase cycles is rely exclusively on appropriate margins determined from the beginning, such that even if the operational characteristics of the nonvolatile memory cells change with an increasing number of program and erase cycles, the operating margins account for any expected varying behavior of the nonvolatile memory cells within the specified lifetime of the nonvolatile memory cells. However, exclusively relying on appropriately determined margins may subject nonvolatile memory cells to unnecessarily extreme operating conditions during part of their lifetimes. Such operating margins impliedly are more stringent than required during at least some portion of the lifetime of a nonvolatile memory cell. During this portion of the lifetime of some nonvolatile memory cells, the unnecessarily extreme operating conditions tend to shorten the lifetime of the nonvolatile memory cells.

Another approach to the varying behavior of nonvolatile memory cells due to an increasing number of program and erase cycles is rely exclusively on specifying a shorter lifetime for the nonvolatile memory cells. Although specifying a shorter lifetime is a simple solution, users of the nonvolatile memory cells must then more frequently replace the nonvolatile memory cells, as the increasing number of program and erase cycles undergone by the nonvolatile memory cells approaches the shorter lifetime. If replacing just the nonvolatile memory cells is impractical or not cost-effective, then the entire product which includes the nonvolatile memory cells is discarded or replaced.

Accordingly, it is desirable to provide apparatuses and methods for accounting for the operational characteristics of nonvolatile memory cells which vary with an increasing number of program and erase cycles over the lifetime of the nonvolatile memory cells.

SUMMARY OF THE INVENTION

One aspect is a method for adjusting operating conditions of nonvolatile memory on an integrated circuit. Data about a number of times an erased threshold state has been established in memory cells on the integrated circuit is maintained, for example in a counting memory associated with the memory cells. A bias procedure for the memory cells is determined based on the data, for example by consulting a look up table that indicates the proper bias procedure for a particular number of erase operations undergone by the memory cells. The bias procedure is then applied to the memory cells.

Other aspects are a nonvolatile memory apparatus and a manufacturing method with the counting memory.

In some embodiments, a memory is updated when the erased threshold state has been established in a group of memory cells for another predetermined number of times. For example, a first set of counting memory will be updated every time the erased threshold state has been established in the group of memory cells, and after the erased threshold state has been established another predetermined number of times, then the first set of counting memory is reset, and a second set of counting memory is updated to indicate that the erased threshold state has been established in the memory cells for another predetermined number of times. This second counting memory can be write-once memory so that a power outage or other error will not result in a large error in the counting memory.

In various embodiments, the bias procedure is programming procedure, an erase procedure, a programming procedure which includes verify, an erase procedure which includes verify.

Other examples of determining the bias procedures include adjusting a sequence of biasing arrangements applied in the bias procedure of the memory cells, adjusting a timing of biasing arrangements applied in the bias procedure of the memory cells, adjusting a duration of at least one biasing arrangement applied in the bias procedure of the memory cells, adjusting a waveform shape of at least one biasing arrangement applied in the bias procedure of the memory cells, adjusting a bias magnitude of at least one biasing arrangement applied in the bias procedure of the memory cells, adding at least one biasing arrangement applied in the bias procedure of the memory cells, and removing at least one biasing arrangement applied in the bias procedure of the memory cells.

DETAILED DESCRIPTION

Figure 1:
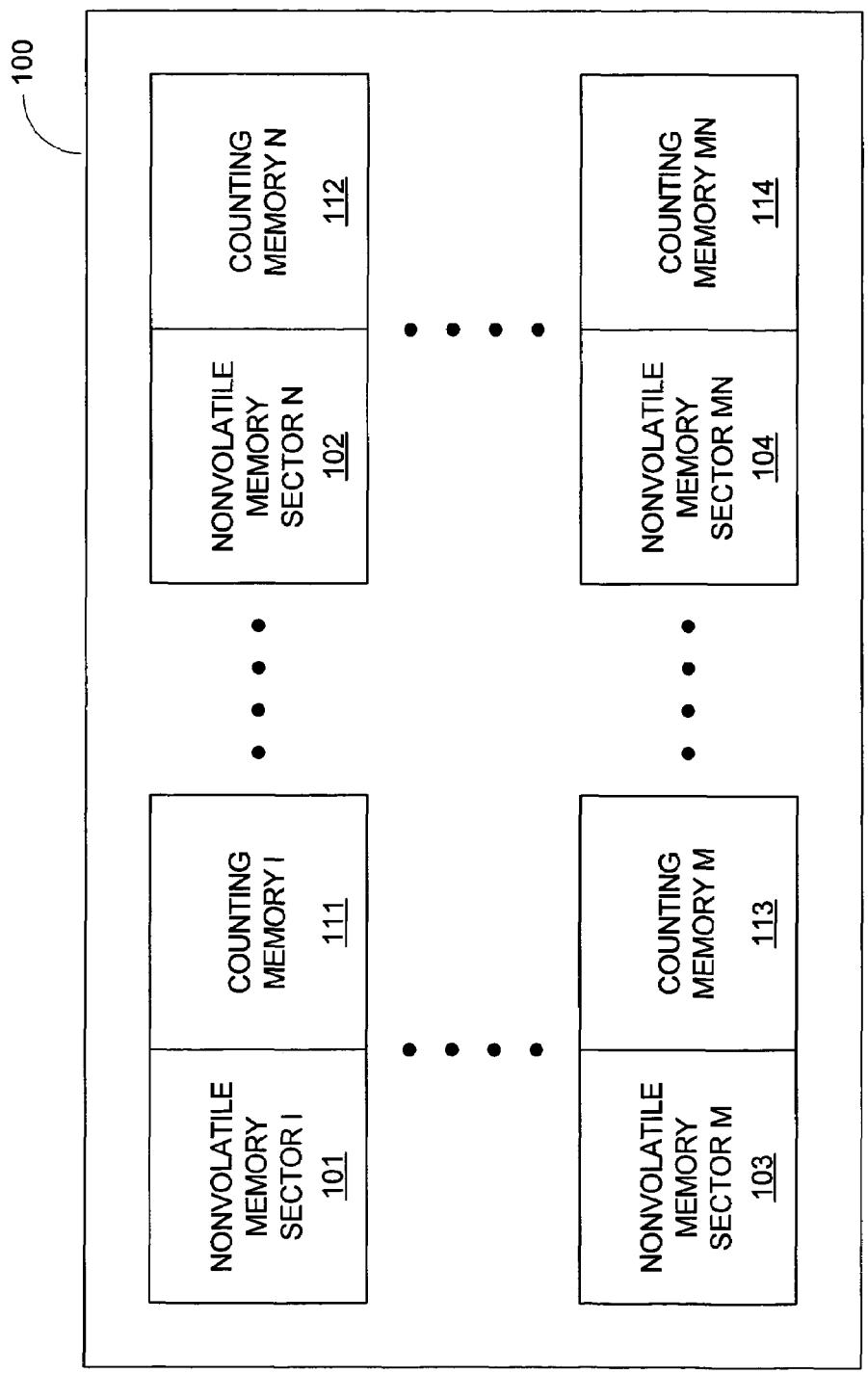
FIG. 1 shows a nonvolatile memory array having nonvolatile memory sectors and counting memory associated with each nonvolatile memory sector.

FIG. 1 shows an embodiment of a nonvolatile memory array 100. The nonvolatile memory array 100 is divided into a plurality of nonvolatile memory sectors, such as nonvolatile memory sector 1 101, nonvolatile memory sector N 102, nonvolatile memory sector M 103, and nonvolatile memory sector MN 104. Each nonvolatile memory sector is associated with a counting memory. For example, nonvolatile memory sector 1 101 is associated with counting memory 1 111, nonvolatile memory sector N 102 is associated with counting memory N 112, nonvolatile memory sector M 103 is associated with counting memory M 113, and nonvolatile memory sector MN 104 is associated with counting memory MN 114. Each time a particular nonvolatile memory sector is erased, the counting memory associated with the nonvolatile memory sector is updated. This data stored in the counting memory is used to adjust the operating conditions of the nonvolatile memory.

Figure 2:
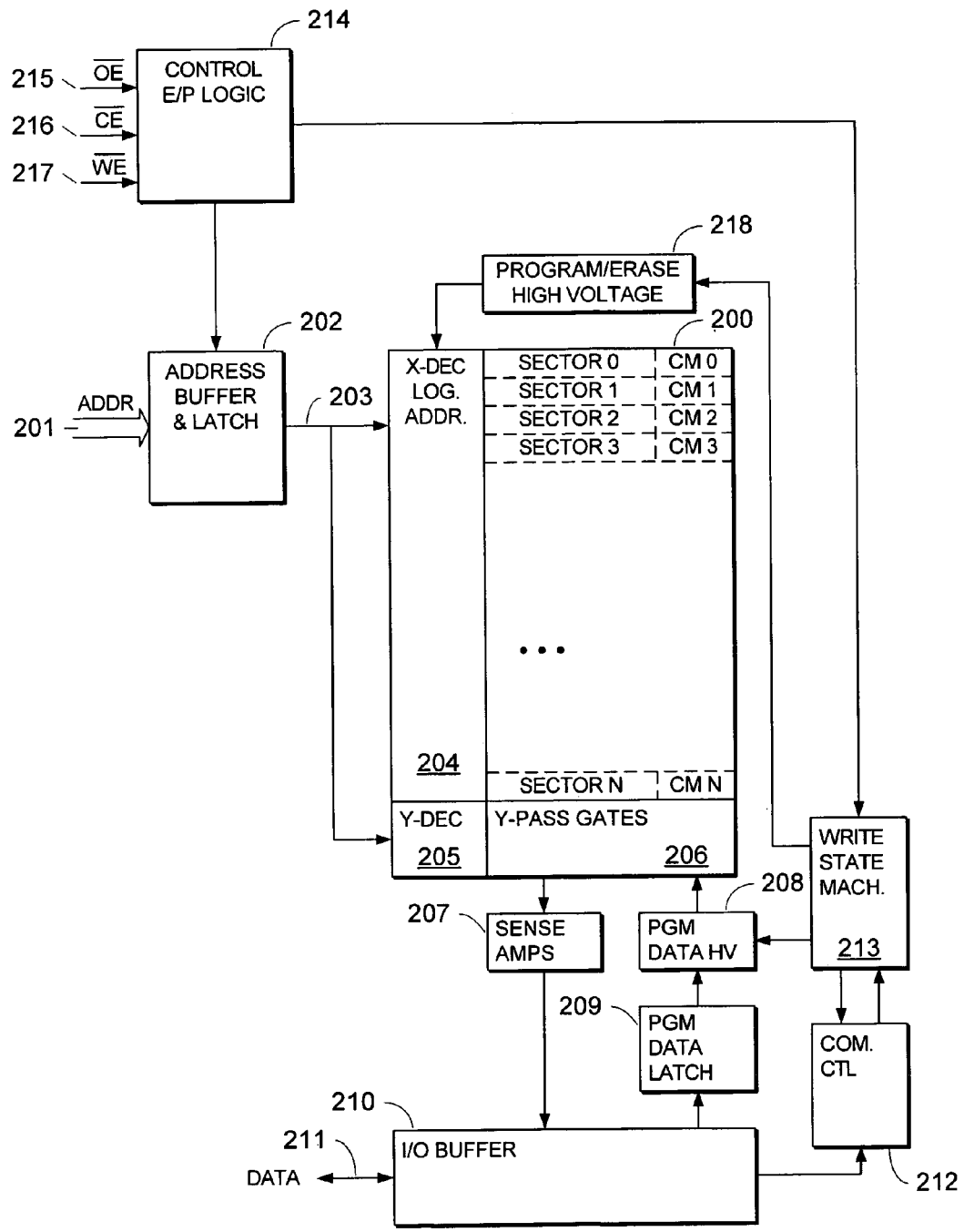
FIG. 2 shows an integrated circuit which includes a nonvolatile memory array with counting memory.

In FIG. 2, an integrated circuit memory is provided with a flash array 200. The array includes a plurality of sectors, sectors 0–N as illustrated in the figure. The plurality of sectors is associated with a plurality of counting memories CM0–CMN as illustrated in the figure. Addresses are supplied on lines 201 to an address buffer and latch 202. The address buffer and latch 202 supplies address signals on line 203 to an X decoder 204 which includes logical addressing, and to a Y decoder 205. The Y decoder is coupled to pass gates 206 for the bit lines. Pass gates connect bit lines in the array 200 to sense amplifiers 207, and to the program data high voltage circuits 208. The program data high voltage circuits 208 are coupled to a program data latch 209 which is in turn connected to input/output I/O buffers 210. Also the sense amplifiers 207 are coupled to the I/O buffers 210. Input and output data are provided on line 211. The I/O buffer 210 is also coupled to a command control block 212 which interprets commands received at the I/O buffer 210. The command control block 212 is coupled to the write state machine 213. The write state machine 213 in turn is coupled with control logic 214 which receives the output enable, chip enable and write enable signals on lines 215, 216 and 217 respectively. Also the write state machine 213 controls the program and erase high voltage circuits 218 which are coupled to the array and to the word line drivers in the X decoder 204.

Figure 3:
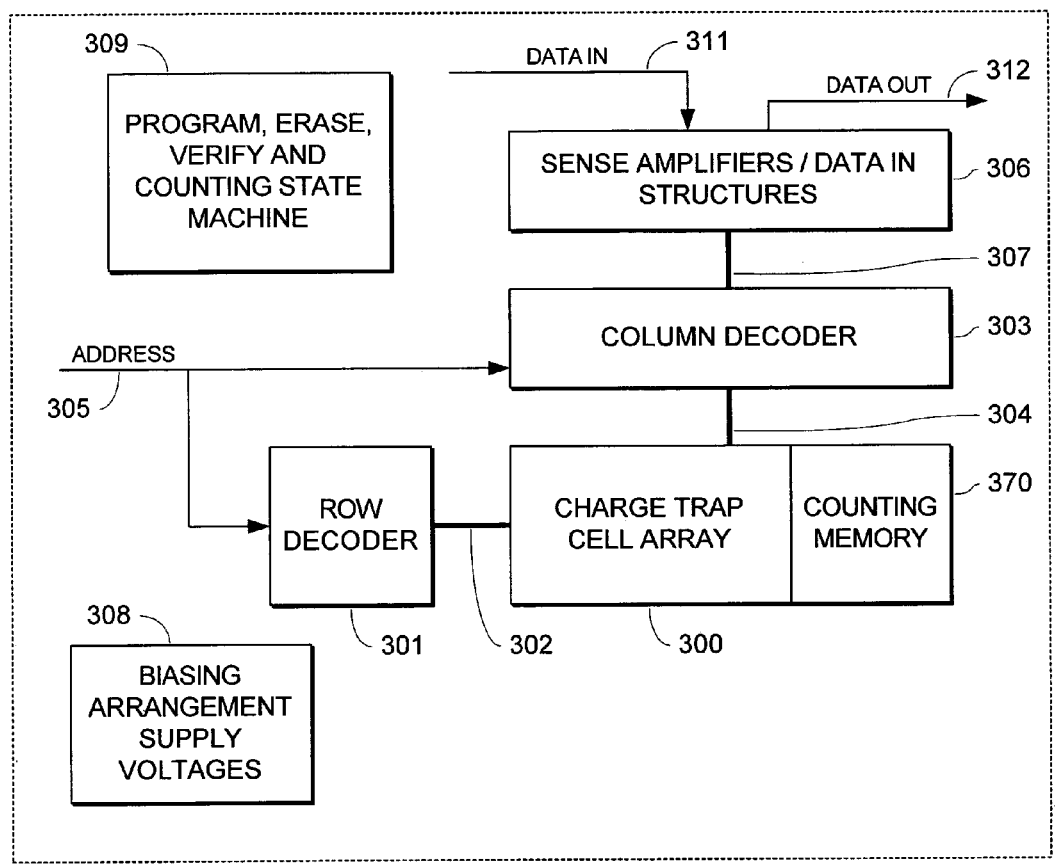
FIG. 3 shows another integrated circuit which includes a nonvolatile memory array with counting memory.

FIG. 3 is a simplified block diagram of an integrated circuit. The integrated circuit 350 includes a memory array 300 implemented using localized charge trapping memory cells, on a semiconductor substrate. The memory array 300 includes counting memory 370. A row decoder 301 is coupled to a plurality of word lines 302 arranged along rows in the memory array 300. A column decoder 303 is coupled to a plurality of bit lines 304 arranged along columns in the memory array 300. Addresses are supplied on bus 305 to column decoder 303 and row decoder 301. Sense amplifiers and data-in structures in block 306 are coupled to the column decoder 303 via data bus 307. Data is supplied via the data-in line 311 from input/output ports on the integrated circuit 350, or from other data sources internal or external to the integrated circuit 350, to the data-in structures in block 306. Data is supplied via the data-out line 312 from the sense amplifiers in block 306 to input/output ports on the integrated circuit 350, or to other data destinations internal or external to the integrated circuit 350. A bias arrangement state machine 309 controls the application of bias arrangement supply voltages 308, such as for the program, erase, erase verify, and program verify voltages, and for the updating data in the counting memory 370.

The write state machine 213 and the command control block 212 of FIG. 2, and the bias arrangement state machine 309 of FIG. 3 determine the bias procedure or writing, reading, and/or erasing based on the number of times an erased threshold state has been established in a memory sector. The verify procedure is adjustable based on this number in some embodiments. Other adjustments are adjusting a sequence of biasing arrangements, a timing of biasing arrangements, a duration of at least one biasing arrangement, a waveform shape of at least one biasing arrangement, a bias magnitude of at least one biasing arrangement, adding a biasing arrangement applied during a biasing procedure, and/or removing a biasing arrangement applied during a biasing procedure. The write state machine 213 and the command control block 212 of FIG. 2 also update memory data on how many times a particular sector 0–N of the array 200 has been erased. The bias arrangement state machine 309 of FIG. 3 updates memory data on how many times a particular sector 0–N of the memory array 300 has been erased.

Figure 4:
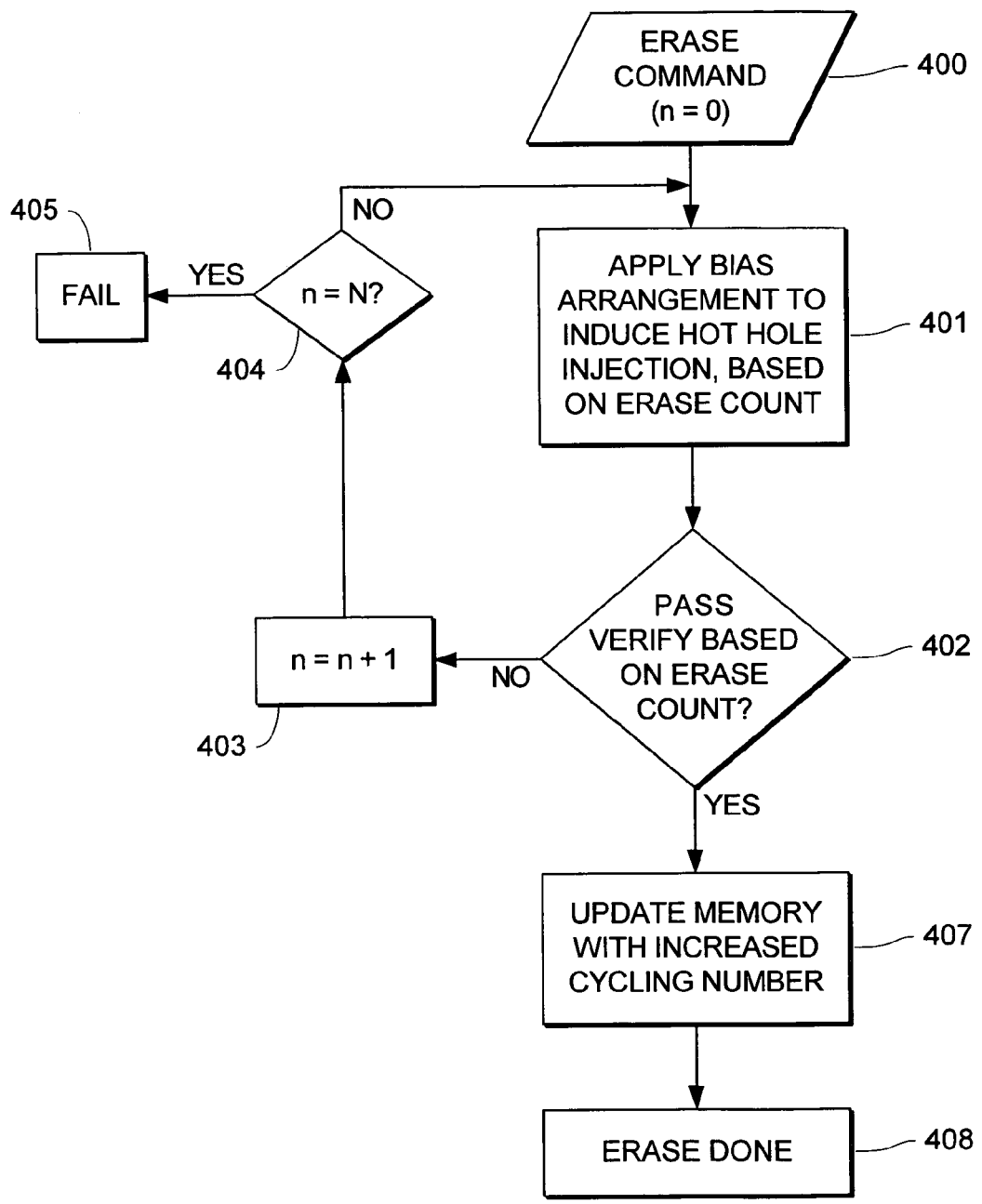
FIG. 4 shows a heuristic of an erase operation with verify being performed on nonvolatile memory.

In FIG. 4, an erase procedure is initiated by an erase command (block 400). Heuristically at this point, an index n is set to zero for use in the erase procedure. The erase command in some implementations corresponds with a "flash" sector erase operation typical for flash memory devices in the art. In response to the erase command, a biasing procedure is instituted. In one embodiment, the first operation in the biasing procedure is to apply a bias arrangement that induces hot hole injection in the sector of memory cells (block 401). For example, word lines in the sector are biased with about –3 to –7 volts, bit lines coupled to the drains of the memory cells are biased with about +3 to +7 volts, and the source lines coupled to the sources of the memory cells in the sector are biased with ground, while the substrate region in which the memory cell channels are formed is grounded. This induces hot hole injection on the side of the charge trapping structure adjacent the drain terminal for the memory cells in the sector being erased. The specific bias procedure applied during the erase procedure is based on a look up table. The look up table is indexed by the number of erase operations undergone by the memory cells. This number is stored in memory associated with the memory cells, and is updated during the lifetime of the memory cells to reflect the increasing number of erase operations undergone by the memory cells.

After applying the hot hole injection bias arrangement, a state machine or other logic determines whether the erase operation has been successful for each cell in the sector by performing an erase verify operation. The specific voltages applied are based on a look up table indexed by the number of erase operations undergone by the memory cells. Thus, in the next step, the algorithm determines whether the memory cells passed the verify operation (block 402). If the cell does not pass verify, then the index n is incremented (block 403), and the algorithm determines whether the index has reached a pre-specified maximum number N of retries (block 404). If the maximum number of retries has been executed without passing verify, then the procedure fails (block 405). If the maximum number of retries has not been executed at block 404, then the procedure returns to block 402 to retry the hot hole injection bias arrangement. If at block 402, the memory cell passes verify, then the algorithm passes, and the counting memory is updated with the increased cycling number (block 407), and erase procedure is finished (block 408). The increased cycling number is accessed next time the sector erase operation is performed on the sector of memory cells. Each time the erase operation is performed, the data stored in the counting memory is used to adjust the erase bias conditions. This addresses the issue of a decrease in erasing speed as the number of times a sector of memory is used increases. Also, each time the verify operation is performed, the data stored in the counting memory is used to adjust the verify bias conditions. This addresses the issue of margin loss as the number of times a sector of memory is used increases.

Figure 5:
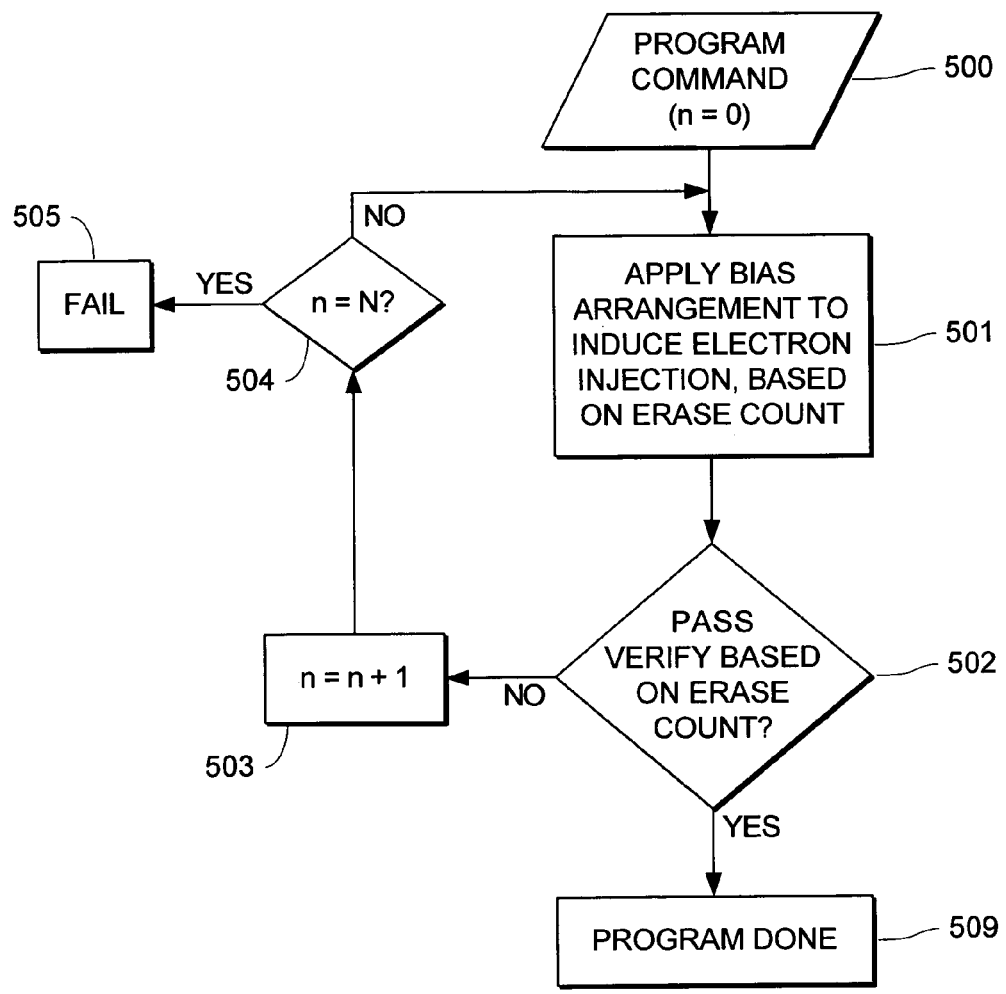
FIG. 5 shows a heuristic of a program operation with verify being performed on nonvolatile memory.

A program procedure, or other procedure adapted to establish a programmed threshold state in the memory cell, as illustrated in FIG. 5. The procedure includes re-fill operations, in which the cell is first biased to induce a programmed threshold state, and then a charge balancing pulse is applied tending to lower the threshold by causing ejection of electrons from shallow traps in the charge trapping structure, and then the charge trapping structure is "re-filled" with negative charge by a second pulse to induce electron injection into the charge trapping structure. In FIG. 5, a program procedure is initiated by a program command (block 500). Heuristically at this point, an index n is set to zero for use in the program retry procedure, and an index m is set to zero for use in counting the refill procedure. The program command in some implementations corresponds with a byte operation typical for flash memory devices in the art. In response to the program command, a biasing procedure is instituted. In one embodiment, the first operation in the biasing procedure is to apply a bias arrangement that induces electron injection memory cells subject of the program operation based on the erase count (block 501). For example, channel initiated secondary electron injection is induced in a first bias arrangement. This induces electron injection on one side of the charge trapping structure in the cells being programmed. After applying the electron injection bias arrangement, a state machine or other logic determines whether the program operation has been successful for each cell using a program verify operation. Thus, in the next step, the algorithm determines whether the memory cells passed the verify operation based on the erase count (block 502). If the cell does not pass verify, then the index n is incremented (block 503), and the algorithm determines whether the index has reached a pre-specified maximum number N of retries (block 504). If the maximum number of retries has been executed without passing verify, then the procedure fails (block 505). If the maximum number of retries has not been executed at block 504, then the procedure returns to block 501 to retry the electron injection bias arrangement. If at block 502, the memory cell passes verify, then the algorithm passes as block 509. Each time the program operation is performed, the data stored in the counting memory is used to adjust the program bias conditions. This addresses the issue of a decrease in programming speed as the number of times a sector of memory is used increases. Also, each time the verify operation is performed, the data stored in the counting memory is used to adjust the verify bias conditions. This addresses the issue of margin loss as the number of times a sector of memory is used increases.

Embodiments of the technology include a updating the erase count prior to, after, or during the actual erase procedure. Also, embodiments of the technology include updating the erase count with every erase operation, every other erase operation, or some other regular or irregular interval less frequent than every erase operation.

Figure 6:
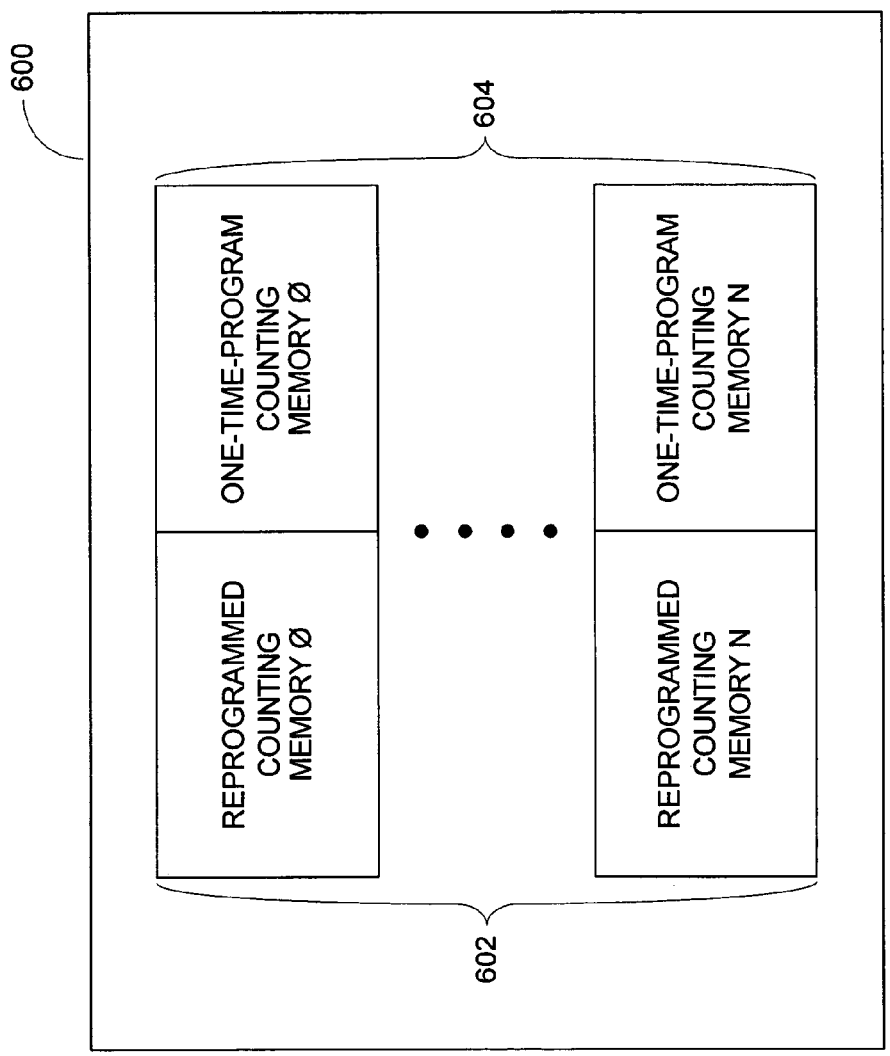
FIG. 6 shows a counting memory with one-time-program memory that is updated each time the counting memory stores a particular value.

Another embodiment of counting memory shown in FIG. 6. In FIG. 6, the counting memory 600 includes a plurality of rewritable counting memories 602, illustrated as reprogrammed counting memory 0–N in the figure. The counting memory 600 also includes a plurality of one-time-program counting memory 0–N 604. The one-time-program counting memory takes into account the fact that the nonvolatile memory associated with the counting memory irreversibly changes behavior with increasing use. The data stored in the counting memory can be inadvertently erased or lost, for example due to a power loss. Particularly if this event occurs multiple times, then the data on the number of times a particular state has been established will no longer accurately reflect the actual number of times that particular state has been established. Such error can be addressed by the use of the one-time-program counting memory 604. For example, after the data stored in the rewritable counting memories 602 is incremented to a particular value M, then the one-time-program counting memory 604 is incremented to record that the memory associated with the rewritable counting memories 602 has reached a particular state another M times, and the rewritable counting memories 602 reset.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for adjusting operating conditions of nonvolatile memory on an integrated circuit, comprising:
    maintaining data about a number of times an erased threshold state has been established in a plurality of nonvolatile memory cells;
    determining a bias procedure of the plurality of nonvolatile memory cells based on the data about the number of times the erased threshold state has been established in the plurality of nonvolatile memory cells; and
    applying the bias procedure to the plurality of nonvolatile memory cells.

2. The method of claim 1, further comprising:
    determining that the erased threshold state has been established in the plurality of memory cells for another predetermined number of times; and
    updating a write-once memory on the integrated circuit to indicate that the erased threshold state has been established in the plurality of nonvolatile memory cells for another predetermined number of times.

3. The method of claim 1, wherein the bias procedure establishes the programmed threshold state in the plurality of nonvolatile memory cells.

4. The method of claim 1, wherein the bias procedure is a programming procedure that includes a verify bias procedure to measure threshold voltages in the plurality of memory cells.

5. The method of claim 1, wherein the bias procedure is an erase procedure that includes a verify bias procedure to measure threshold voltages in the plurality of memory cells.

6. The method of claim 1, wherein said determining includes adjusting the bias procedure applied to the plurality of nonvolatile memory cells to establish the erased threshold state in the plurality of nonvolatile memory cells.

7. The method of claim 1, wherein said determining includes adjusting a sequence of biasing arrangements applied in the bias procedure of the plurality of nonvolatile memory cells.

8. The method of claim 1, wherein said determining includes adjusting a timing of biasing arrangements applied in the bias procedure of the plurality of nonvolatile memory cells.

9. The method of claim 1, wherein said determining includes adjusting a duration of at least one biasing arrangement applied in the bias procedure of the plurality of nonvolatile memory cells.

10. The method of claim 1, wherein said determining includes adjusting a waveform shape of at least one biasing arrangement applied in the bias procedure of the plurality of nonvolatile memory cells.

11. The method of claim 1, wherein said determining includes adjusting a bias magnitude of at least one biasing arrangement applied in the bias procedure of the plurality of nonvolatile memory cells.

12. The method of claim 1, wherein said determining includes adding at least one biasing arrangement applied in the bias procedure of the plurality of nonvolatile memory cells.

13. The method of claim 1, wherein said determining includes removing at least one biasing arrangement applied in the bias procedure of the plurality of nonvolatile memory cells.

14. The method of claim 1, further comprising:
updating a one-time-program memory each time the data has been updated to a particular value.

15. The method of claim 1, further comprising:
updating a one-time-program memory each time the data has been updated to a particular value, and resetting the data to zero.

16. An apparatus for adjusting operating conditions of nonvolatile memory on an integrated circuit, comprising:
a nonvolatile memory array, including:
a first plurality of memory cells storing at least one of an erased threshold state and a programmed threshold state; and
a second plurality of memory cells storing at least one of the erased threshold state and the programmed threshold state, wherein the second plurality of memory cells store data about a number of times the erased threshold state has been established in the first plurality of memory cells; and
control circuitry coupled to the nonvolatile memory array, the control circuitry causing:
maintaining the data in the second plurality of memory cells about the number of times the erased threshold state has been established in the first plurality of memory cells; and
applying a bias procedure to the first plurality of memory cells based on the data about the number of times the erased threshold state has been established in the first plurality of memory cells.

17. The apparatus of claim 16, further comprising:
a third plurality of memory cells on the integrated circuit coupled to the control circuitry,
wherein the control circuitry determines from the data that the erased threshold state has been established in the first plurality of memory cells for another predetermined number of times, and updates the third plurality of memory cells to indicate that the erased threshold state has been established in the first plurality of memory cells for another predetermined number of times.

18. The apparatus of claim 16, wherein the bias procedure to establishes the programmed threshold state in the plurality of memory cells.

19. The apparatus of claim 16, wherein the bias procedure is a programming procedure that includes a verify bias procedure to measure threshold voltages in the first plurality of memory cells.

20. The apparatus of claim 16, wherein the bias procedure is an erase procedure that includes a verify bias procedure to measure threshold voltages in the first plurality of memory cells.

21. The apparatus of claim 16, wherein, based on the data, the control circuitry adjusts the bias procedure applied to the first plurality of memory cells to establish the erased threshold state in the first plurality of memory cells.

22. The apparatus of claim 16, wherein, based on the data, the control circuitry adjusts a sequence of biasing arrangements applied in the bias procedure of the first plurality of memory cells.

23. The apparatus of claim 16, wherein, based on the data, the control circuitry adjusts a timing of biasing arrangements applied in the bias procedure of the first plurality of memory cells.

24. The apparatus of claim 16, wherein, based on the data, the control circuitry adjusts a duration of at least one biasing arrangement applied in the bias procedure of the first plurality of memory cells.

25. The apparatus of claim 16, wherein, based on the data, the control circuitry adjusts a waveform shape of at least one biasing arrangement applied in the bias procedure of the first plurality of memory cells.

26. The apparatus of claim 16, wherein, based on the data, the control circuitry adjusts a bias magnitude of at least one biasing arrangement applied in the bias procedure of the first plurality of memory cells.

27. The apparatus of claim 16, wherein, based on the data, the control circuitry adds at least one biasing arrangement applied in the bias procedure of the first plurality of memory cells.

28. The apparatus of claim 16, wherein, based on the data, the control circuitry removes at least one biasing arrangement applied in the bias procedure of the first plurality of memory cells.

29. A method for manufacturing an apparatus for adjusting operating conditions of nonvolatile memory on an integrated circuit, comprising:
providing a semiconductor substrate;
forming a nonvolatile memory array on the semiconductor substrate, the nonvolatile memory array including:
a first plurality of memory cells storing at least one of an erased threshold state and a programmed threshold state; and
a second plurality of memory cells storing at least one of the erased threshold state and the programmed threshold state, wherein the second plurality of memory cells store data about a number of times the erased threshold state has been established in the first plurality of memory cells; and
forming control circuitry on the semiconductor substrate coupled to the nonvolatile memory array, the control circuitry causing:
maintaining the data in the second plurality of memory cells about the number of times the erased threshold state has been established in the first plurality of memory cells; and
applying a bias procedure to the first plurality of memory cells based on the data about the number of times the erased threshold state has been established in the first plurality of memory cells.

* * * * *